United States Patent [19]
Ling et al.

[11] Patent Number: 5,966,601
[45] Date of Patent: Oct. 12, 1999

[54] METHOD OF MAKING NON-VOLATILE SEMICONDUCTOR MEMORY ARRAYS

[75] Inventors: Chen Ling, Sunnyvale, Calif.; Siu-han Liao, Hsinchu, Taiwan

[73] Assignee: Holtek Microelectronics Inc., Hsinchu, Taiwan

[*] Notice: This patent issued on a continued prosecution application filed under 37 CFR 1.53(d), and is subject to the twenty year patent term provisions of 35 U.S.C. 154(a)(2).

[21] Appl. No.: 08/786,598

[22] Filed: Jan. 21, 1997

[51] Int. Cl.$^6$ .................................................. H01L 29/788
[52] U.S. Cl. ........................................ 438/257; 257/315
[58] Field of Search .................................. 257/314, 315, 257/316, 321; 438/257, 267, 265

[56] References Cited

U.S. PATENT DOCUMENTS

| | | | |
|---|---|---|---|
| 5,149,665 | 9/1992 | Lee | 437/43 |
| 5,204,542 | 4/1993 | Namaki et al. | 257/315 |
| 5,274,588 | 12/1993 | Manzur et al. | 257/314 |
| 5,280,446 | 1/1994 | Ma et al. | 257/314 |
| 5,282,160 | 1/1994 | Yamagata | 257/314 |
| 5,379,254 | 1/1995 | Chang | 257/315 |
| 5,409,854 | 4/1995 | Bergemont | 257/315 |
| 5,416,349 | 5/1995 | Bergemont | 257/316 |
| 5,554,867 | 9/1996 | Ajika et al. | 257/315 |
| 5,589,413 | 12/1996 | Sung et al. | 437/43 |
| 5,592,001 | 1/1997 | Asano | 257/316 |
| 5,834,806 | 11/1998 | Lin et al. | 257/306 |

OTHER PUBLICATIONS

Kobayashi et al, "Memory Array Architecture and Decoding Scheme for 3V Only Sector Erasable Dinor Flash Memory", IEEE Journal of Solid State Circuits, vol. 29, No. 4, Apr. 1994 pp. 454–460, Apr. 1994.

*Primary Examiner*—Olik Chaudhuri
*Assistant Examiner*—Phat X. Cao
*Attorney, Agent, or Firm*—W. Wayne Liauh

[57] ABSTRACT

A new structure of a non-volatile semiconductor memory cell array and a method of fabricating the memory arrays. The circuit layout of the memory array not only comprises of the conventional floating gates, control gates, cell sources and cell drains, but also adds the local source regions to increase the coupling ratio. Besides, the new design can reduce the number of metal contact windows, further increase the packing density of the memory array. Furthermore, an additional isolation region is formed between two bit lines so as to increase the distance between two bit lines, which can minimize the possibility of cross talk due to shirking spacing.

7 Claims, 11 Drawing Sheets

|  |  | Program | Erase | Read |
|---|---|---|---|---|
| Word Line | Selected | −HV | +HV | +LV |
|  | Unselected | GND | GND | GND |
| Local Bit Line | Selected | +LV | GND | +Read LV |
|  | Unselected | GND | GND | GND |
| Local Source Line |  | Floating | GND | GND |

METHOD OF MAKING NON-VOLATILE SEMICONDUCTOR MEMORY ARRAYS

BACKGROUND OF THE INVENTION

1. Field of the Invention

The invention relates to a method of fabricating non-volatile semiconductor memory devices, and more particularly to a memory device employing local sources having improved coupling ratio.

2. Description of the Prior Art

The trend of recent semiconductor device developing is that high density non-volatile memory has been expected to replace some part of the huge external storage device market of computers, because of its easy to access and low power dissipation.

Figure 1:
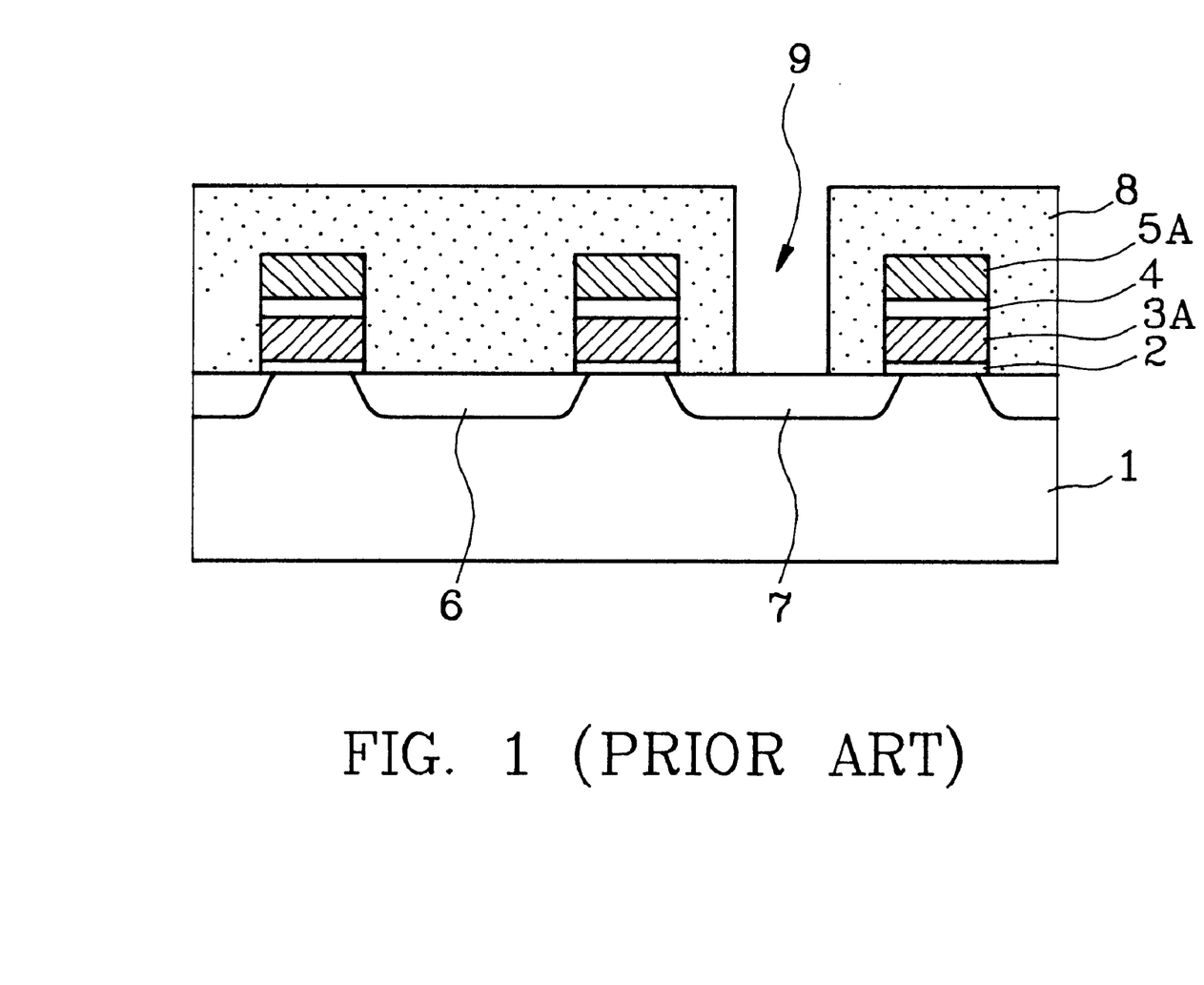
FIG. 1 shows a cross-sectional view of the non-volatile memory cell according to the prior art.

Please refer now to FIG. 1, there is shown a cross sectional view of the conventional stack non-volatile memory array cell. A tunnel oxide 2 and a first polysilicon 3A layers are grown on a semiconductor substrate 1. The tunnel oxide layer and the first polysilicon layers are patterned by the conventional lithography and plasma-etching techniques to form the floating gates. A first dielectric 4 and a second polysilicon 5A layers are then deposited overlaying the floating gates. The first dielectric layer is typically made of oxide/nitride/oxide (ONO) sandwich structure. Thereafter, the control gates are patterned.

Figure 2:
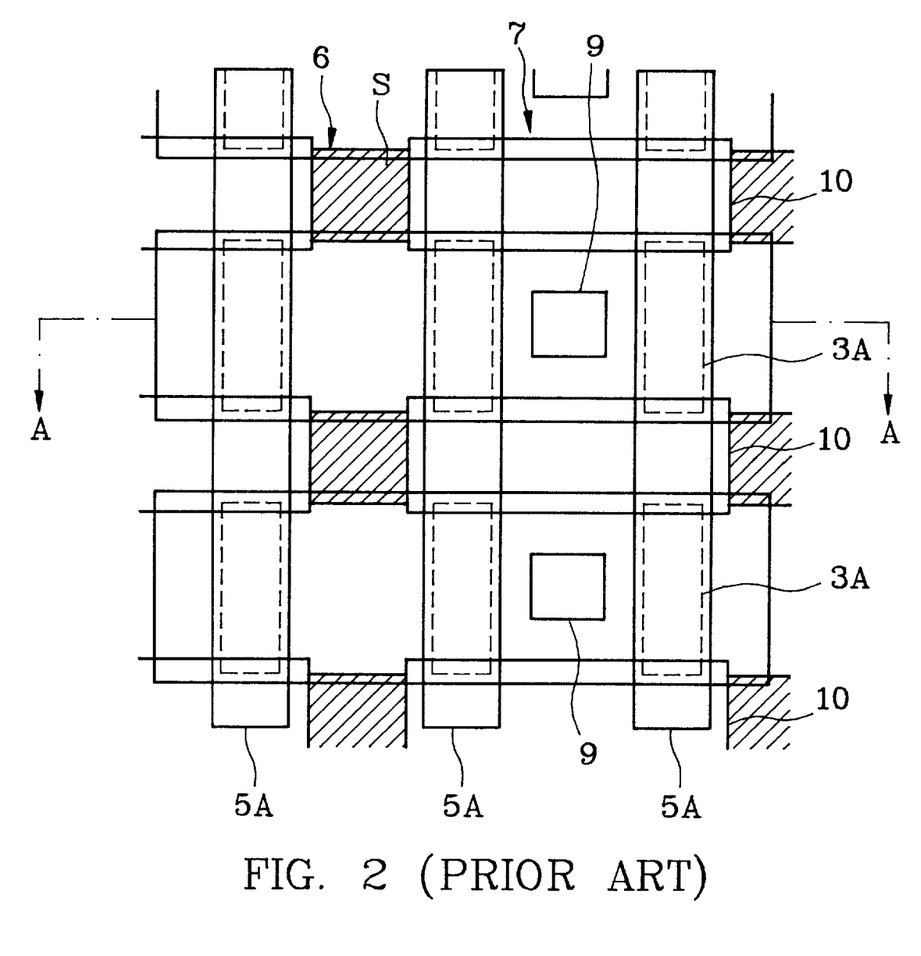
FIG. 2 shows the prior art non-volatile memory cell circuit layout corresponding to FIG. 1.

Next, source 6 and drain 7 regions are formed by ion implanting dopants into the semiconductor substrate which is not covered by the gates. A second dielectric layer 8 (usually made of doped oxide) is deposited on the entire substrate surface. Finally, contact windows 9 are opened by lithography and plasma-etching techniques again. The basic structure of a non-volatile memory cell is completed. Referring now to FIG. 2, there is shown the cell layout corresponding to FIG. 1. The areas marked 10 are the isolation regions.

According to the description above, there must be a contact window for every two cells that limits the packing density of the memory array. Besides, the silicon substrate which is not covered by the first polysilicon (S area of FIG. 2) has great possibilities to be undercut during the self-aligned etching process, which increases the resistance of the source lines. Furthermore, the distance between two adjacent metal lines is too close when cell size continuously shirking that creates cross talk problem. All these drawbacks degrade the performance of the non-volatile memory arrays. Therefore, the present invention provides a new design approach which reduces the cell area compared with the conventional cell without suffering the above problems.

SUMMARY OF THE INVENTION

It is the object of the present invention to provide a method of fabricating the non-volatile semiconductor memory array having higher coupling ratio.

It is another object of the present invention is to provide a novel design of the non-volatile semiconductor memory cell which can reduce the cell area and increase the packing density.

It is yet another object of the present invention to provide an easy and manufacturable non-volatile memory cell structure which can cut down the production cost.

It is a further object of the present invention to provide a low operation voltage non-volatile memory array which is portable.

It is still a further object of the present invention to provide an additional isolation region between two adjacent bit lines of the non-volatile memory cell which can improve the reliability of the device.

In accordance to these objects of this invention, a new method of fabricating non-volatile semiconductor memory array with high coupling ratio is achieved. First, a field oxide layer for isolation and a tunnel oxide layer are formed on the surface of the silicon substrate. Then, the active device area and isolation region are defined by the conventional lithography and etching techniques. Next, a first polysilicon layer is deposited, followed by the conventional lithography and plasma etching techniques to form the floating gate pattern. Then, a first dielectric, a metal polycide and a second dielectric layers are sequentially deposited overlaying the floating gate. Thereafter, the control gate pattern is formed by the conventional lithography and plasma etching techniques again. Next, the ion implantation technique is employed to form the cell source and cell drain regions of the non-volatile memory array. A cell source/drain oxide layer is then grown on the silicon substrate surface, followed by the spacer oxide layer deposition. The oxide spacers are formed on the sidewalls of the floating gates by the vertically unisotropically plasma-etching technique. Finally, the local bitline and local source are formed simultaneously that is one of the key points of the present invention. The non-volatile semiconductor memory cell array of the present invention is accomplished.

BRIEF DESCRIPTION OF THE DRAWINGS

In the accompanying drawings forming a material part of this description, there is shown.

DESCRIPTION OF THE PREFERRED EMBODIMENTS

Figure 3A:
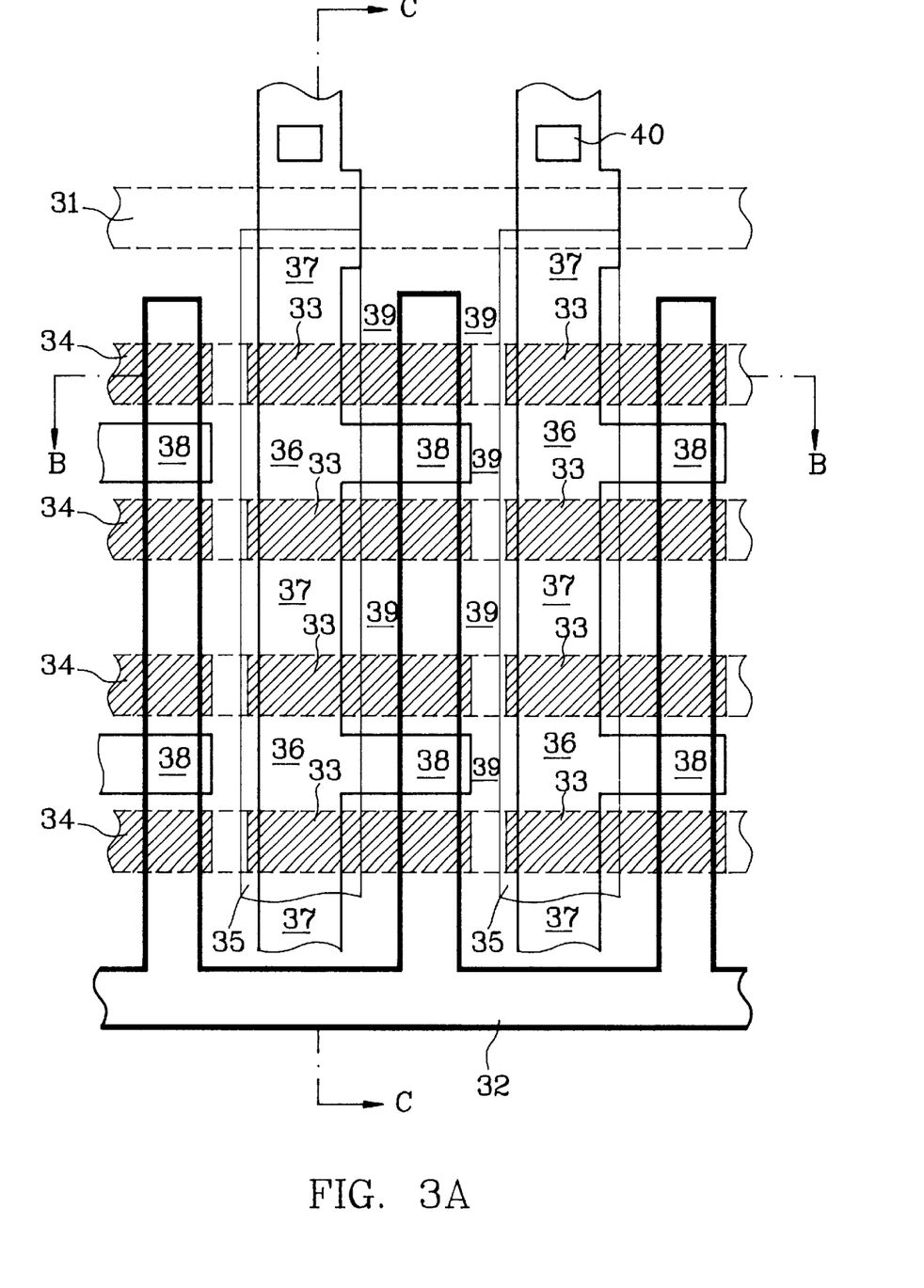
FIG. 3A shows the circuit layout of the non-volatile of the non-volatile memory cell according to the first preferred embodiment of the present invention.

Referring now more particularly to FIG. 3A, there is shown the non-volatile memory cell circuit layout of the first preferred embodiment of the present invention. The memory cell comprises of: top select lines 31, selecting the cell address of the memory array; common source line 32; a plural columns and rows of floating gates 33, locating on the surface of a silicon substrate; a plural rows of control gate 34, continuously locating above the floating gates 33; a plural columns of local bitlines 35, locating on the surface of the silicon substrate; a plural columns of cell sources 36 and cell drains 37, alternatively arranging under the local bitlines 35, and the cell sources 36 and cell drains 37 are separated by the control gates 34; a plural rows of local sources 38, alternatively arranging with the cell drains 37 in each row; a plural columns of isolation region 39, isolating the adjacent cell drain 37 and local source 38.

Figure 3B:
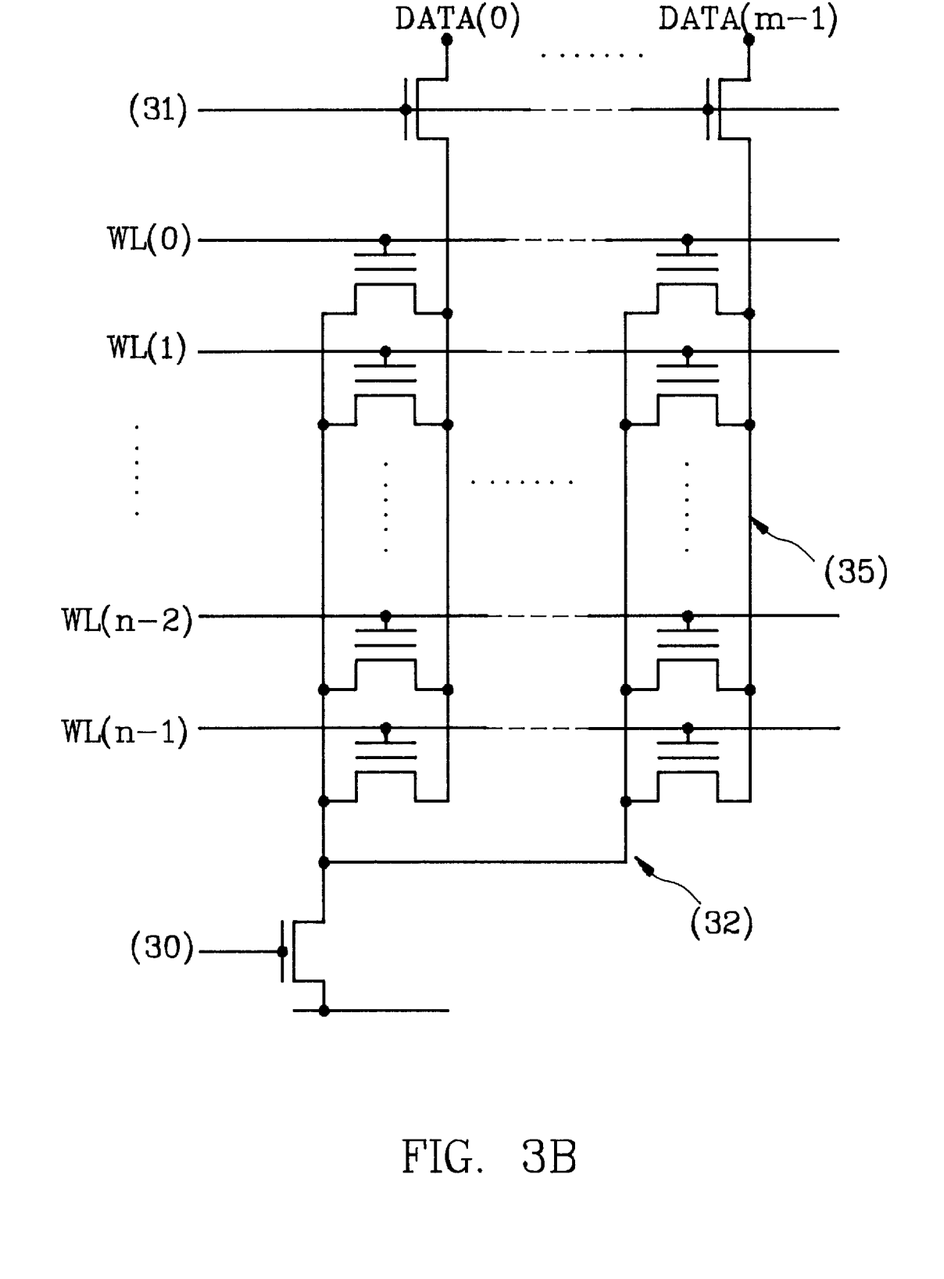
FIG. 3B shows the equivalent circuit diagram corresponding to FIG. 3A.

Referring now to FIG. 3B, there is shown the equivalent circuit diagram corresponding to FIG. 3A. The local source lines are connected to the common source line 32 which is controlled by one bottom select 30 only. The symbols of WL(0)iB WL(1)iB . . . iBWL(n-2)iBWL(n-1) are representing the wordlines, while the symbols of Data(0)iB . . . iBData(m-1) are representing the datalines. The horizontal wordlines and the vertical datalines cross each other to form the n by m array structure.

Figure 3C:
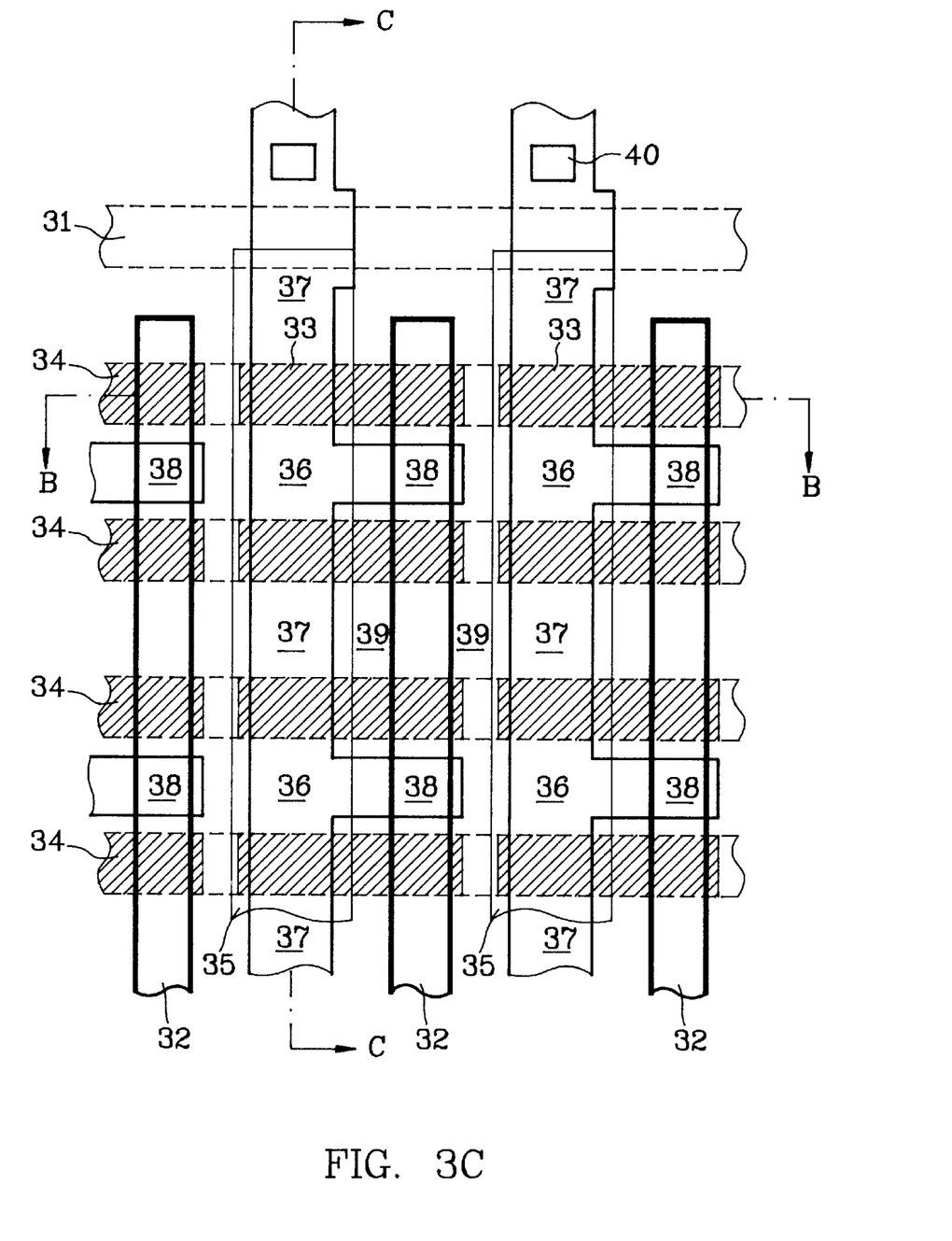
FIG. 3C shows the circuit layout of the non-volatile memory cell according to the alternating embodiment of the present invention.

Referring now to FIG. 3C, there is shown the non-volatile memory cell circuit layout of the alternating embodiment of the present invention. The layout is basically the same with the first preferred embodiment of FIG. 3A. The only difference is that each local source line 38 is independently controlled by its own control line.

Figure 3D:
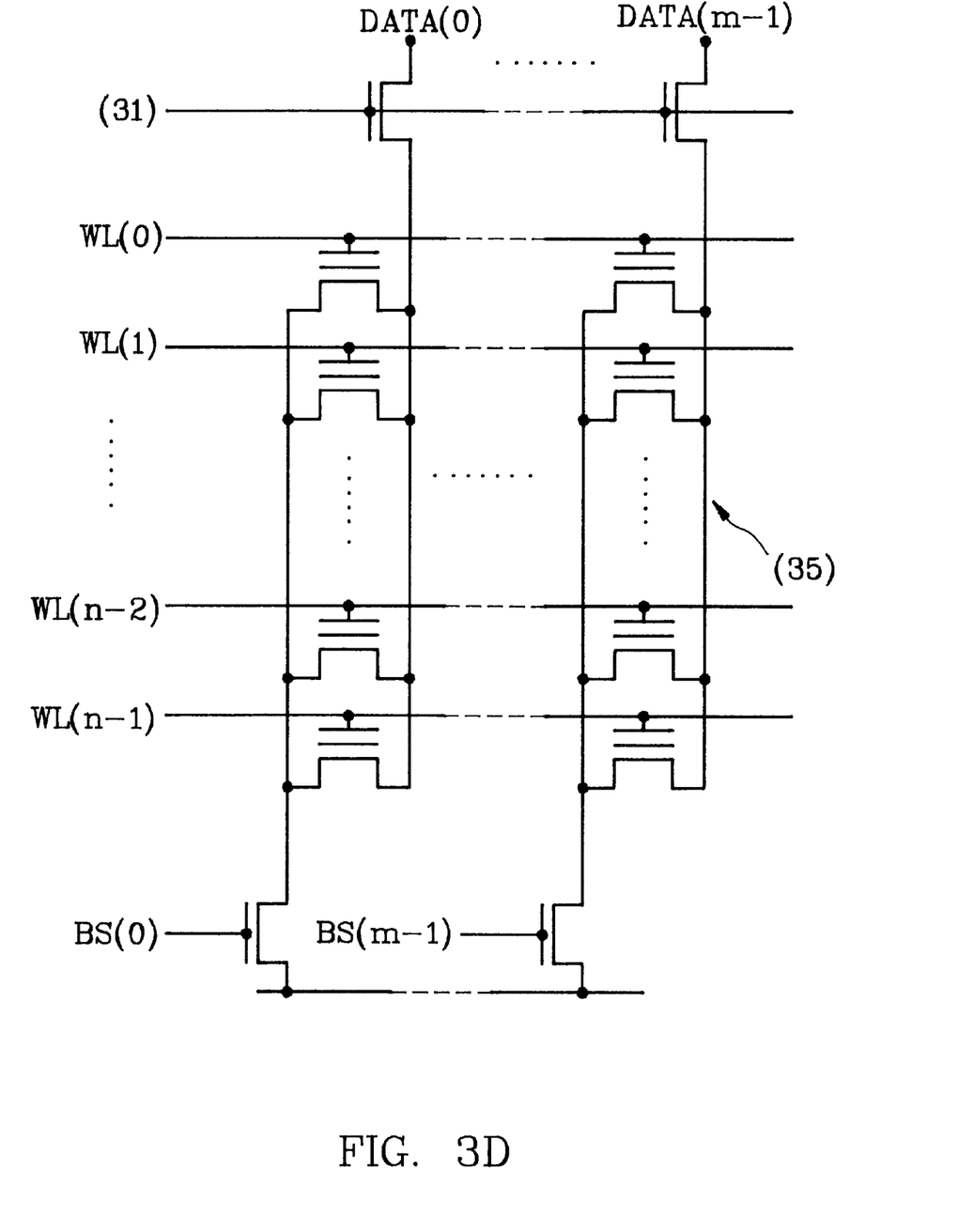
FIG. 3D shows the equivalent circuit diagram corresponding to FIG. 3C.

Referring now to FIG. 3D, there is shown the equivalent circuit diagram corresponding to FIG. 3D. The local source lines are individually controlled by independent control lines of BS(0)iB . . . iBBS(m-1).

Referring to FIGS. 3E through 3L, the preferred embodiments of the present invention will be described in details. In the following description, numerous details are set forth in order to provide a thorough understanding of the present invention. It will be appreciated by one skilled in the art that variations of these specific details are while still achieving the results of the present invention. In other instance, well-known processing steps are not described in detail in order not unnecessarily to obscure the present invention.

Figure 3E:
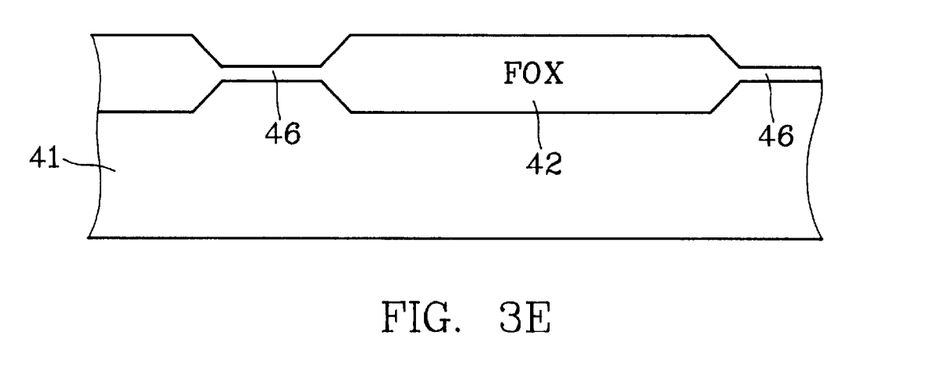
FIG. 3E through 3K schematically show the cross sectional view of the non-volatile memory cell according to the preferred embodiments of the present invention.

Referring now to FIG. 3E, there is shown a cross sectional view of a partially completed silicon substrate which is cut from the word line direction BB of FIG. 3A. The starting material of the present invention is a monocrystalline P-type silicon substrate 41. First, a field oxide layer 42 for isolation and a tunnel oxide layer 46 are formed on the surface of the silicon substrate 41. The field oxide layer 42 may be formed by forming a layer of Silicon Oxide and Silicon Nitride thereon. Thereafter, an active device area and an isolation region are defined by the conventional lithography and etching techniques. The field oxide layer may serve as the isolation region. Because the silicon oxide layer on the silicon nitride grows slowly, a thin silicon oxide layer may be formed after the silicon nitride layer is removed. The active device area comprises of: cell channel; and cell source/drain regions.

The field oxide layer 42 is grown by thermal oxidation method, using steam at a temperature between about 900 to 1200° C., to a thickness of about 3000 to 6500 Angstroms. The tunnel oxide layer 46 is also formed by thermal oxidation, to a thickness of about 50 to 120 Angstroms.

Figure 3F:
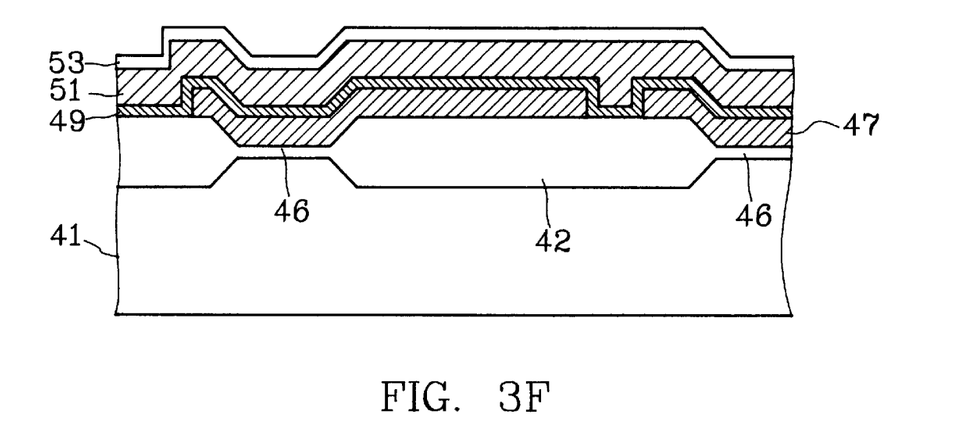

Referring now to FIG. 3F, there is shown a cross sectional view of the silicon substrate also from the word line direction BB. First, a first polysilicon layer 47 is deposited, followed by the conventional lithography and plasma etching techniques to form the floating gate pattern. Then, a first dielectric 49, a metal polycide 51 and a second dielectric 53 layers are sequentially deposited overlaying the floating gate. Thereafter, the control gate pattern is formed by the conventional lithography and plasma etching techniques again.

The first polysilicon layer 47 is usually formed by in-situ phosphorus doped LPCVD method under a mixture of (15%PH$_3$+85%SiH$_4$) and (5%PH$_3$+95%N$_2$), the total pressure is about 1 torr, and at the reaction temperature about 550° C. to obtain a thickness of between 500 to 2000 Angstroms. The first polysilicon plasma etching process can use magnetic enhanced reactive ion etching (MERIE), electron cyclotron etching (ECR) or the conventional reactive ion etching (RIE) methods with reactant gases such as Cl$_2$, SF$_6$ and HBr. The first dielectric layer 49 is usually using oxide/nitride/oxide (ONO) triple layer with the equivalent oxide thickness of about 100 to 300 Angstroms. The polycide layer 51 is usually made of metal polycide materials such as tungsten silicide (WSi) or titanium silicide (TiSi) by low pressure chemical vapor deposition (LPCVD) technique to a thickness of about 1000 to 3000 Angstroms. The second dielectric layer is usually made of oxide or nitride by LPCVD technique also to a thickness of about 1000 to 3000 Angstroms.

Figure 3G:
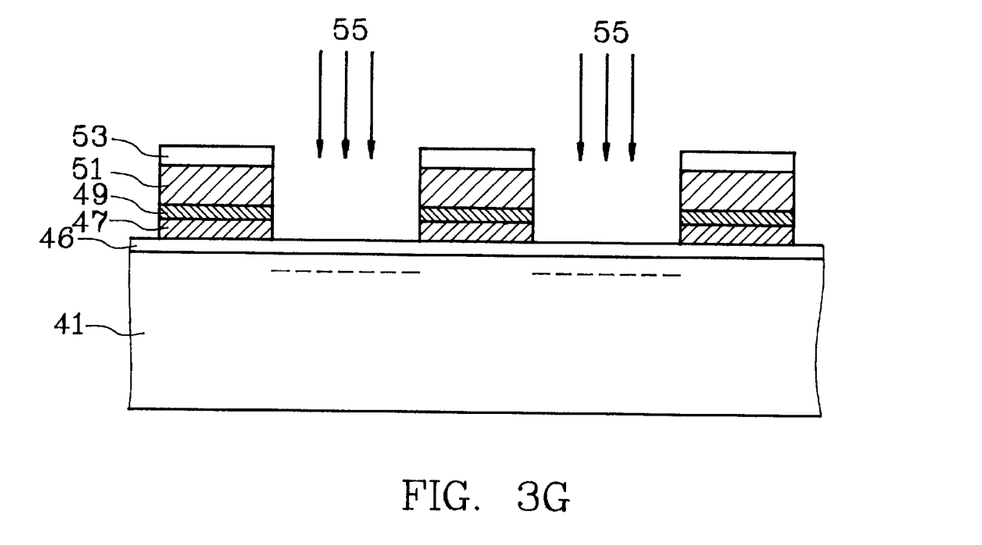

Next, FIGS. 3G through 3K are the cross sectional views of the silicon substrate from the local bitline direction CC. Referring now to FIG. 3G, the ion implantation technique is employed to form the cell source and cell drain regions of the non-volatile memory array such as flash memory or the electrical programmable read only memory (EPROM) arrays. This is accomplished via ion implantation of arsenic (As$^{75}$) ions, at an energy of 20 to 80 keV, and a dose between about 1E15 to 5E15 cm$^{-2}$.

Figure 3H:
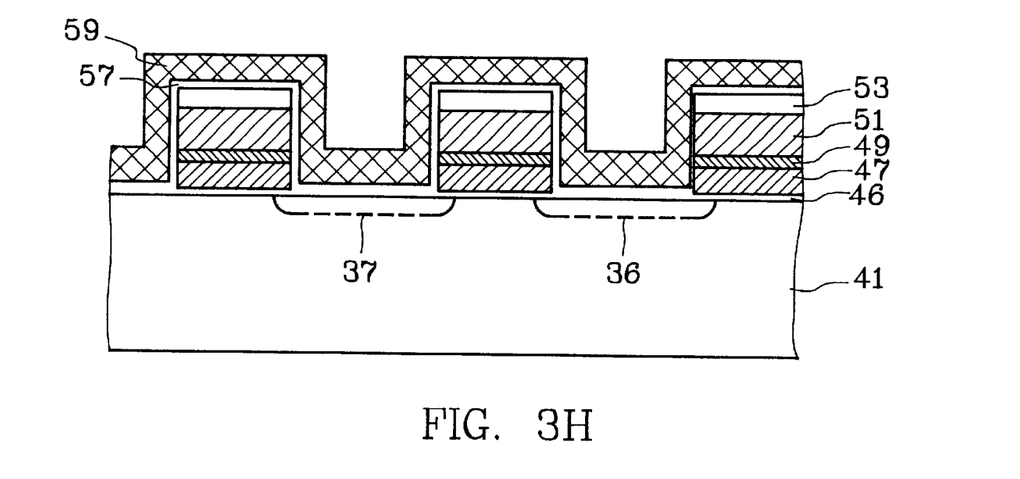

Referring now to FIG. 3H, first, a cell source/drain oxide layer 57 is grown on the silicon substrate surface, followed by the spacer oxide layer 59 deposition. The cell source/drain oxidation step is also severed as dopant drive in step, which is performed at a temperature range of about 900 to 1000° C. for about 30 minutes in a nitrogen ambient environment with less oxygen for the purpose of obtaining the desired junction depth. The spacer oxide layer 59 is usually made of silicon dioxide such as TEOS by the LPCVD or PECVD technique to a thickness of about 2000 to 4000 Angstroms.

Figure 3I:
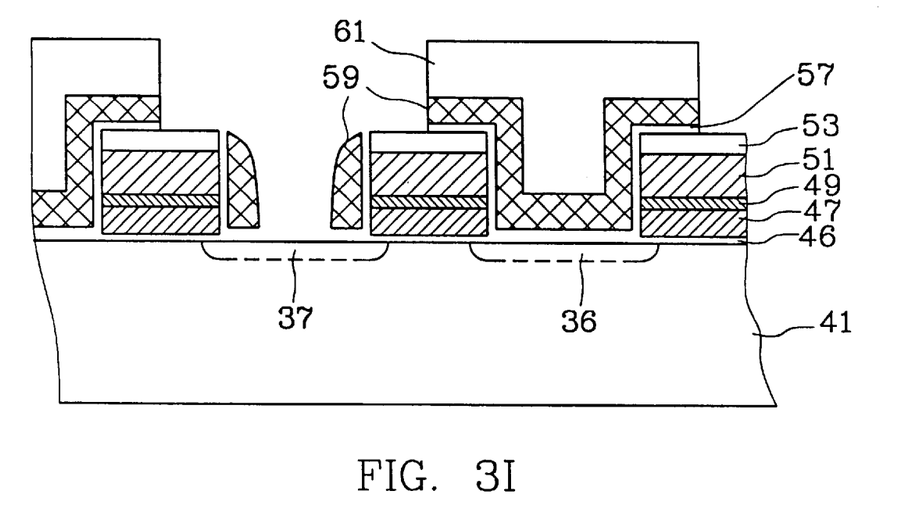

Referring now to FIG. 3I, the photoresist pattern 61 is formed by the conventional lithography technique to protect the oxide layer above the cell source 36 region, but unprotect the drain area 37 and source area 38. The oxide spacers 59 are then formed on the sidewalls of the floating gates by the vertically unisotropically plasma-etching technique. The oxide plasma etching process is used the magnetic enhanced reactive ion etching (MERIE) method with reactant gases such as CF$_4$, CHF$_3$ and Ar.

Figure 3J:
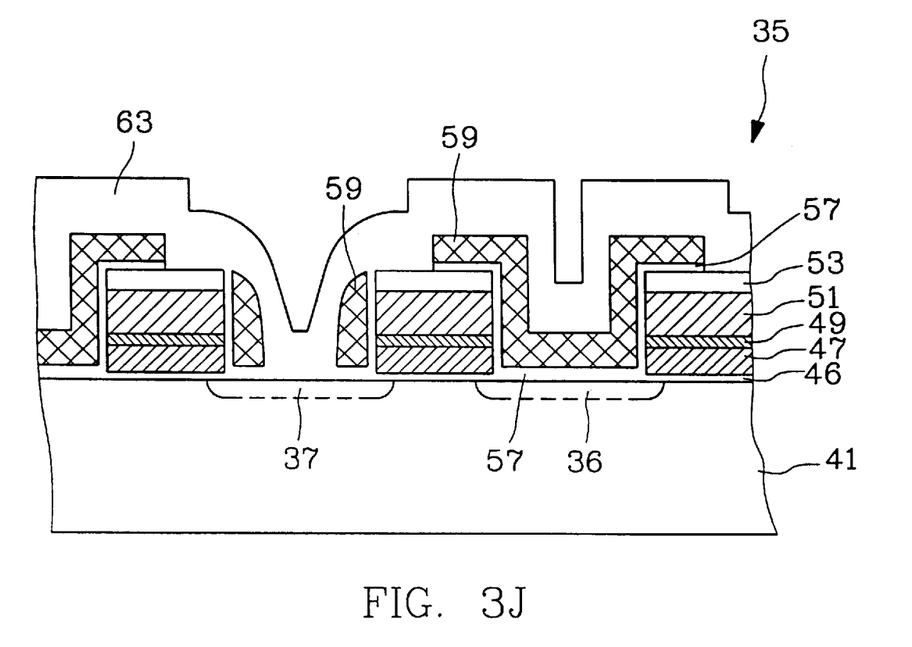
Figure 3K:
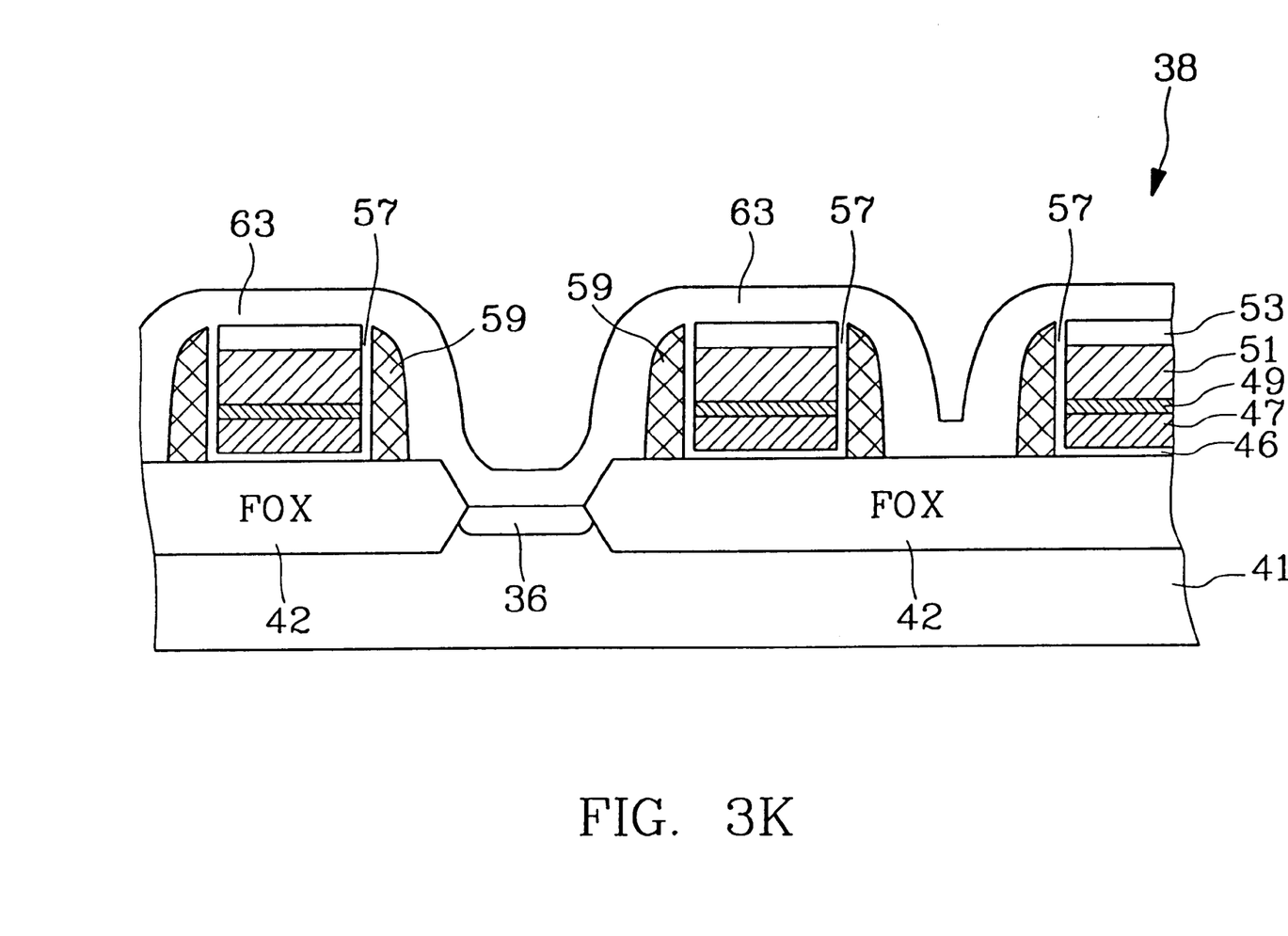

Referring now to FIGS. 3J and 3K, the local bitline and local source line are formed simultaneously that is one of the key points of the present invention. First, a conducting layer 63 which has a thickness of about 2000 to 4000 Angstroms is deposited over the entire silicon substrate. Then, the local bitline and local source line patterns are formed by the conventional lithography and plasma etching techniques. The conducting layer is usually made of low resistivity materials such as polysilicon, tungsten, tungsten silicide (WSi) or titanium silicide (TiSi). FIG. 3J is the cross sectional view of the silicon substrate from the local bitline 35 of FIG. 3A, while FIG. 3K is the cross sectional view of the silicon substrate from the local source line 32 of FIG. 3A. The non-volatile semiconductor memory cell array of the present invention is completed.

Figure 3L:
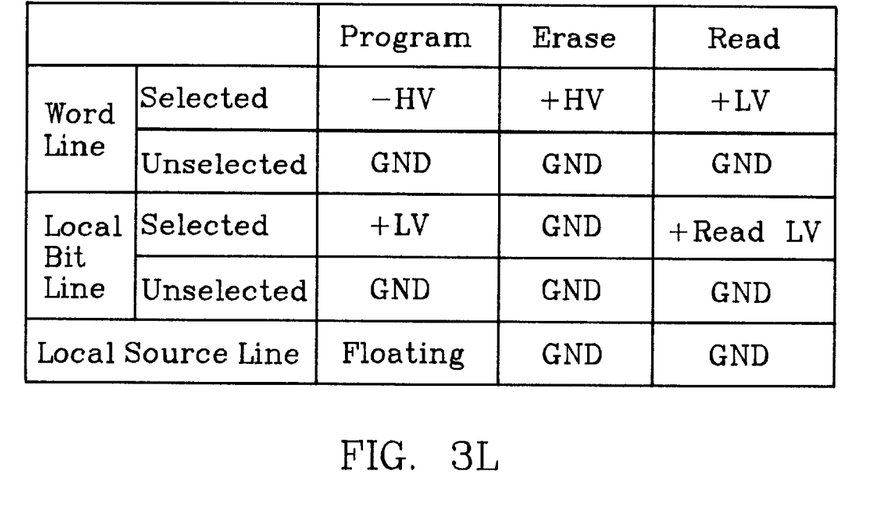
FIG. 3L shows the examples of the cell operation conditions obtainable with the preferred embodiments of the present invention.
Figure 3M:
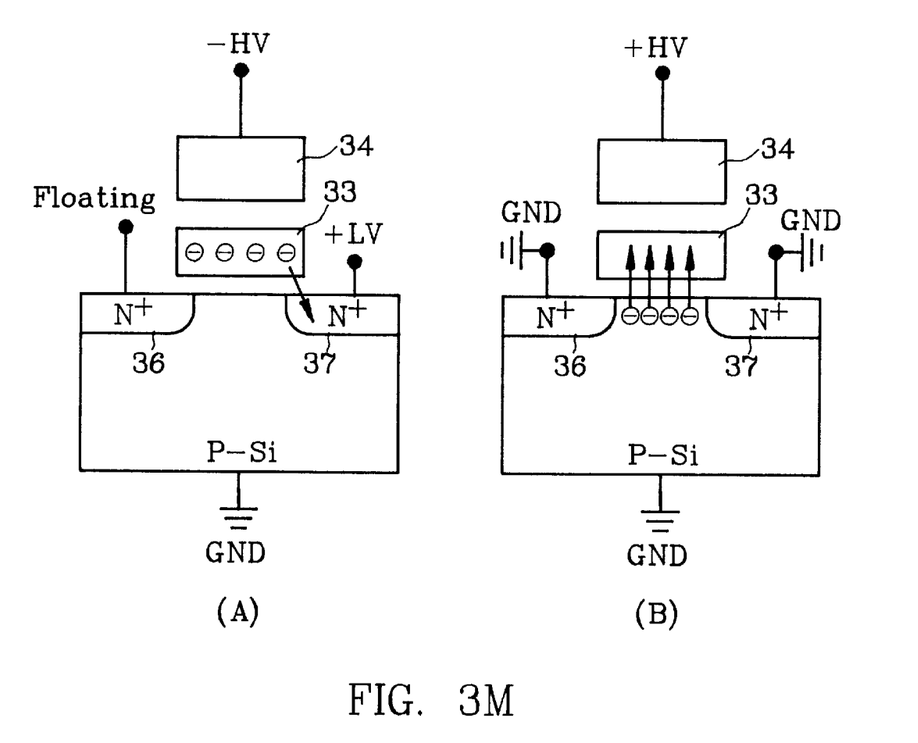
FIG. 3M shows the Program Erase diagrams and their bias conditions corresponding to FIG. 3L.

Finally, referring now to FIG. 3L, an example of the cell operation conditions is shown. To program the cell, a pulse of low positive voltage (LV) is applied to the selected local bitline (drain) 37, with the selected wordline (control gate) 34 tied to a high negative voltage (−HV), the electrons are injected from floating gate 33 to local bitline 37 as shown in FIG. 3M(a). On the other hand, to erase the cell, a pulse of high positive voltage (HV) is applied to the selected wordline (control gate) 34, with the selected bitline (drain) 37 and local source 38 both tied to ground, the electrons are moving from channel to floating gate 33 as shown in FIG. 3M(b). To read the data stored in the cell, a pulse of low positive voltage (LV) is applied to both the selected wordline (control gate) 34 and bitline (drain) 37.

While the invention has been particularly shown and described with reference to a preferred embodiment, it will be understood by those skilled in the art that various changes in form and detail may be made therein without departing from the spirit and scope of the present invention.

What we claimed is:

1. A method for fabricating a non-volatile semiconductor memory cell, comprising the steps of:
   (a) providing a P-type semiconductor substrate;
   (b) forming a field oxide region and a tunnel oxide layer on said substrate;
   (c) forming a first polysilicon layer on said substrate;
   (d) sequentially depositing a first dielectric layer, a metal polycide layer, and a second dielectric layer overlaying said polysilicon layer to form a multi-layered structure;
   (e) forming a plurality of stacked gates from said multi-layered structure using lithography and plasma-etching techniques, wherein each stacked gate containing, from top to bottom, said second dielectric layer, said metal polycide layer, said first dielectric layer, and said first polysilicon layer, and said first polysilicon layer becoming a floating gate and said metal polycide layer becoming a control gate;
   (f) using said stacked gates as a mask, ion-implanting N-type impurities into a predetermined region of said substrate to form cell sources and cell drains;
   (g) growing a cell source/drain oxide layer overlaying entire said substrate;
   (h) depositing a thick oxide layer overlaying entire said substrate including said source drain region and covering entire said stacked gates
   (i) forming a photoresist to protect the portion of said thick oxide layer which overlays said cell sources as well as cover sidewalls of said stacked gates adjacent to said cell sources;
   (j) using an anisotropic etching technique to expose said cell drains and form sidewall spacers from said thick oxide layer adjacent to said cell drains, while leaving said cell sources and the portion of said stacked gates connected to said cell sources protected by a remaining portion of said thick oxide layer;
   (k) depositing a conducting layer overlaying entire said substrate, then using lithography and plasma-etching techniques to form local sources and local bitlines from said cell drains in alternating locations, wherein said cell sources are insulated from said local sources and said local bitlines by said thick oxide layer, and said local sources and said local bitlines are formed without the need to specifically form contacts thereto.

2. The method for fabricating a non-volatile semiconductor memory cell according to claim 1 wherein said first polysilicon layer has a thickness between 500 and 2,000 Angstroms.

3. The method for fabricating a non-volatile semiconductor memory cell according to claim 1 wherein said metal polycide layer has a thickness between 1,000 and 3,000 Angstroms.

4. The method for fabricating a non-volatile semiconductor memory cell according to claim 1 wherein said first dielectric layer has an oxide/nitride/oxide structure with an aggregate oxide thickness between 100 and 300 Angstroms.

5. The method for fabricating a non-volatile semiconductor memory cell according to claim 1 wherein said N-type impurities are arsenic ions, which are ion-implanted at an energy level between 20 and 80 keV, and a dose between IE15 and 5E15 cm$^{-2}$.

6. The method for fabricating a non-volatile semiconductor memory cell according to claim 1 wherein said conducting layer has a thickness between 2,000 and 4,000 Angstroms.

7. The method for fabricating a non-volatile semiconductor memory cell according to claim 1 wherein said conducting layer is formed from a material selected from the group consisting of polysilicon, tungsten, tungsten silicide, and titanium silicide.

* * * * *